United States Patent [19]

Estes

[11] Patent Number: 5,297,008
[45] Date of Patent: Mar. 22, 1994

[54] POLYMERIC COMPOSITE LEAD WIRE AND METHOD FOR MAKING SAME

[75] Inventor: Howard S. Estes, Houston, Tex.

[73] Assignee: Compaq Computer Corporation (COMPAQ), Houston, Tex.

[21] Appl. No.: 815,425

[22] Filed: Dec. 31, 1991

[51] Int. Cl.⁵ ............................................. H01R 9/00
[52] U.S. Cl. ................................... 361/773; 361/760; 361/776; 361/813; 174/52.2; 174/255; 257/690; 257/787; 439/66
[58] Field of Search ............... 361/380, 400, 401, 408, 361/420, 421, 760, 761, 762, 765, 773, 776, 813, 810; 174/52.2, 258, 255, 261; 257/690, 787; 439/66, 91, 161

[56] References Cited

U.S. PATENT DOCUMENTS

| | | |
|---|---|---|
| 4,089,733 | 5/1978 | Zimmerman . |
| 4,112,196 | 9/1978 | Selig et al. . |
| 4,521,801 | 6/1985 | Kato et al. . |
| 4,673,967 | 6/1987 | Hingorany ............................. 357/70 |
| 4,722,470 | 2/1988 | Johary ............................. 228/180.2 |
| 4,762,499 | 8/1988 | Johnson, Jr. . |
| 4,884,335 | 12/1989 | McCoy et al. . |
| 4,967,260 | 10/1990 | Butt . |

Primary Examiner—Leo P. Picard
Assistant Examiner—Young Whang
Attorney, Agent, or Firm—Synnestvedt & Lechner

[57] ABSTRACT

Electrical leads are provided for improving access to high density electronic devices. The leads include a polymeric dielectric core comprising a metallic conductive layer having at least two separate conductive paths thereon. The conductive paths are ideally suited to connect a pair of terminals disposed on a circuit element to a pair of conductive surfaces on a printed circuit board, without requiring any additional surface area to meet the lead requirements.

24 Claims, 3 Drawing Sheets

POLYMERIC COMPOSITE LEAD WIRE AND METHOD FOR MAKING SAME

FIELD OF THE INVENTION

This invention relates to the manufacture of lead wires suitable for providing circuit continuity between an electronic device and a printed circuit board, and more particularly, to composite lead wires for permitting multiple conductive paths for electricity.

BACKGROUND OF THE INVENTION

In the manufacturing of electronic devices used in microelectronic applications, a lead frame is often employed between the molded base and lid components of a chip package. The lead frame is typically a metal or a metal alloy of about 0.01 inch thick and is connected to the output terminals of the chip with a plurality of tiny bond wires.

Recently, there has been an increased tendency for electronic device manufacturers to increase circuit density. As this circuitry becomes more densified, a larger number of terminal paths and leads are required to contact the chip with the printed circuit board. Conventional lead frames are suitable for devices requiring about 16 to 32 leads. However, since modern chips may require many times this traditional number of leads, conventional lead frames, and the leads extending from these lead frames, are not considered satisfactory.

Prior artisans have attempted to increase the lead count through better alignment of the lead frame and the use of thinner lead frames, also called tape lead frames, which provide thinner stock material for permitting closer spacing between leads. Although these lead assemblies permit closer spacing, flexibility, mechanical strength, and registration are often a problem. Metal tape also has little structural strength on its own and is difficult to position properly.

Although automated bonding and photolithography have minimized some of the deficiencies associated with thin leads, device density continues to outrun the permissible number of leads dictated by current technology.

SUMMARY OF THE INVENTION

Improved electrical leads, assemblies, and semiconductor devices are provided by this invention, which are designed to increase the number of conductive paths leading from integrated circuits. The electrical leads of this invention include a polymeric dielectric core having disposed thereon a metallic conductor layer comprising at least two separate conductive paths. The conductive paths are preferably located along peripheral edge regions of the dielectric core. By removing a portion of the conducting metal layer on the cores of this invention, a number of conductive paths for any given number of leads can be multiplied by at least a factor of two.

The leads of this invention therefore provide more than one circuit path for chip devices so that higher density chips may be employed without resorting to the complexities of tape foils or photolithography. The leads of this invention are easy to produce with ordinary injection molding and plating skills, which also minimize the cost of the overall package or component.

In further aspects of these invention, lead assemblies are provided having male and female assembly joining means for connecting leads having multiple conductive paths. The lead assemblies of this invention are useful in increasing the lead count of conventional quad packs, but are readily suitable for any desired package, including dual-in-line and single-in-line packages, as well as leadless surface mount components.

BRIEF DESCRIPTION OF THE DRAWINGS

The accompanying drawings illustrate preferred embodiments of this invention so far devised for the practical application of the principles thereof, and in which.

DETAILED DESCRIPTION OF THE INVENTION

Electrical leads, semiconductor devices including these leads, and methods for manufacturing leads are provided by this invention. The teachings and concepts provided herein are designed to provide at least twice as many conductive paths with the same number of leads currently employed by semiconductor devices.

Figure 1A:
FIGS. 1a–c describe a preferred fabrication sequence for a lead of this invention illustrating side elevation views of a preferred lead during various coating steps.

With reference to FIGS. 1a–e, there is shown sequentially, a series of side elevation views depicting the coating stages for preparing a preferred plated lead embodiment 25 of this invention. In FIG. 1a, an elongated polymeric dielectric core 10 is provided. The core preferably includes a high strength, high density resin. Such resins preferably include polymers which are dielectrics and which can be plated. Ideal candidates are also injection moldable so as to enable the simultaneous fabrication of a plurality of lead cores within a single mold. Other desirable attributes for the resin of this invention include excellent dimensional stability and electrical properties. Acceptable candidates for this resin include, for example, polyester, epoxy, nylon, polysulfone, and polypropylene.

The resin cores of this invention may optionally contain reinforcing fibers, such as chopped glass fibers. The molded cores may contain as little as 5 wt. % and as much as 60 wt. % chopped glass fibers. Preferably, for the best cost to performance ratios, the cores of this invention contain about 20–40 wt. % glass fibers. Glass fiber reinforcement improves most mechanical properties of plastics by a factor of 2 or more. The tensile strength of nylon, for example, can be increased from about 10,000 to over 25,000 psi, and the deflection temperature of this material can be improved to almost 500° F., from 170° F. Reinforced polyester, for example, has double the tensile and impact strength and four times the flexural modulus of the unreinforced resin.

Figure 1B:
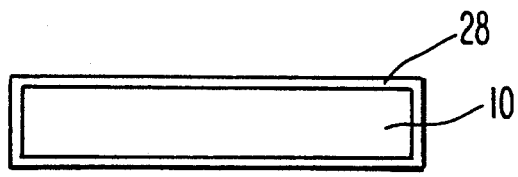

With reference to FIG. 1b, there is shown a preferred metallic conductor layer 28 disposed along a peripheral region of the polymeric core 10. In this embodiment, the conductor layer 28 is a electroless copper composition which is provided continuously along the peripheral top, bottom and transverse side edges, or lateral sides, of the core 10. It is important to note that the lateral sides of the core 10 are covered and sealed during the electroless deposition process to prevent plating on these surfaces. This step readily facilitates the production of two conductive paths 20 and 21 by merely removing a portion of the copper plating of conductor layer 28 at two peripheral locations 22 and 24, such as disclosed in FIG. 1c. The electroless copper coating of the conductor layer 28 can be removed by abrading, cutting, routing, or trimming with a laser. Alternatively, masking may be employed at peripheral locations 22 and 24 during the plating process to prevent the deposition of copper or other conductive metal.

Figure 1C:
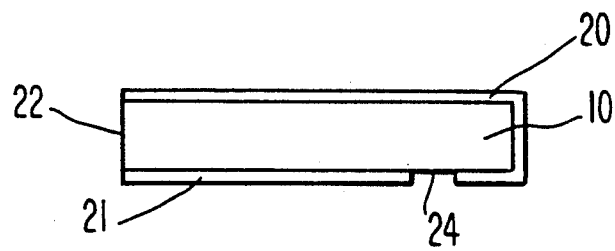
Figure 1D:
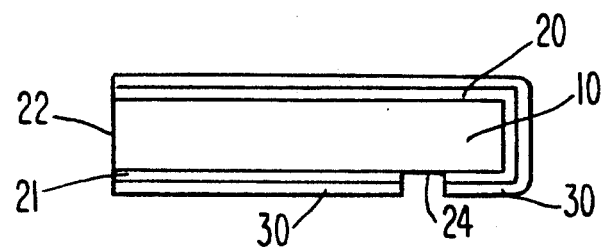
Figure 1E:
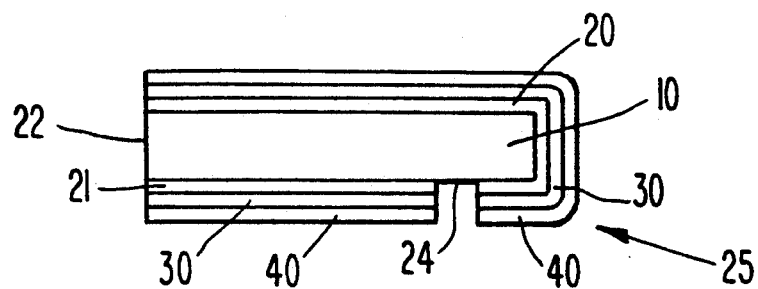

As described in FIG. 1d, following the electroless copper deposition, and the removal of material to provide two conductive paths 20 and 21, an electroplated copper layer 30 is deposited over the electroless copper layer. Electroplated copper provides a higher purity copper coating, which is less resistant to the passage of electricity. The electroplated copper is readily deposited onto the electroless copper layer, and will not adhere to the open dielectric sites at peripheral locations 22 and 24. In order to further promote subsequent soldering operations, a tinning layer 40 is thereafter provided onto the electro-deposited copper layer 30 to provide the final plated lead embodiment 25. The tinning layer 40 preferably includes a conventional solder material, such as 63 Sn-37 Pb, which is applied preferably by electroplating or dip tinning.

Figure 2A:
FIGS. 2a–c illustrate side elevation views of an alternative laminated lead during a fabrication process in which a metal foil is mechanically applied to a dielectric core.
Figure 2B:
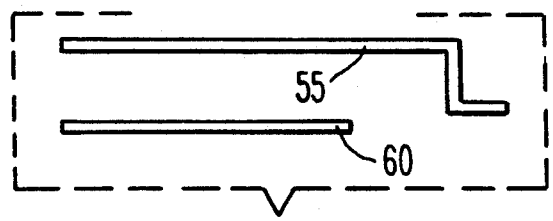
Figure 2C:
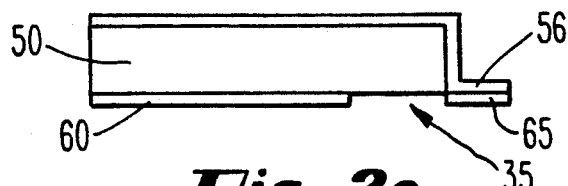

In an alternative manufacturing sequence of this invention described in FIGS. 2a-c, a polymeric dielectric core 50, made of similar materials as core 10, is injection molded. Core 50 of this manufacturing sequence is preferably mechanically joined to the conductive metallic foils 55 and 60 described in FIG. 2b. These foils 55 and 60 are preferably formed, cut, and positioned over a pair of planar top and bottom surfaces of the core 50, and are thereafter mechanically pressed or deformed onto the core to provide the laminated structure described in FIG. 2c. The mechanical forming step can be facilitated by employing known laminating, stamping, explosion bonding, or cladding techniques, to form the final laminated lead embodiment 35. Since mechanical forming techniques provide more flexibility for lead structure designs, an extended foot portion 56 can be provided for enabling joining to an integrated circuit terminal pad or a printed circuit board conductor. Preferably, the extended foot portion 56 is pretinned or electroplated with a tinning layer 65 to facilitate subsequent soldering or similar joining techniques. As with plated lead embodiment 25, the laminated lead embodiment 35 can be subsequently coated with electroplated copper and tinning layers over the conductive metallic foils 55 and 60.

Figure 3A:
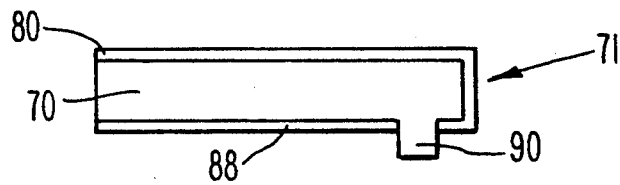
FIGS. 3a–b illustrate, in side elevation views, preferred male and female lead portions for providing a lead assembly.
Figure 3B:
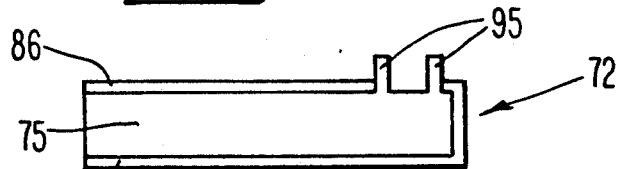

In further electrical lead embodiments of this invention described in FIGS. 3a-b, assembly joining means are provided for connecting a plurality of the electrical leads to further increase the number of conductive paths connecting a component to a printed circuit board. In the embodiment described in FIG. 3a, an electrical lead is provided including an elongated polymeric dielectric core 70 of the type previously described, but further including an extending dielectric male portion 90. This male electrical lead 71 also preferably includes two conductive paths 80 and 88 which include conducting metal electroless or electroplated copper layers, also as previous described. As shown in FIG. 3b, a female electrical lead component 72 is provided which exhibits a dielectric core 75 having a extending dielectric female portion 95. The female electrical lead embodiment 72 also exhibits a pair of conductive paths 85 and 86 which can be suitably provided and thereafter coated as previously discussed.

Figure 4A:
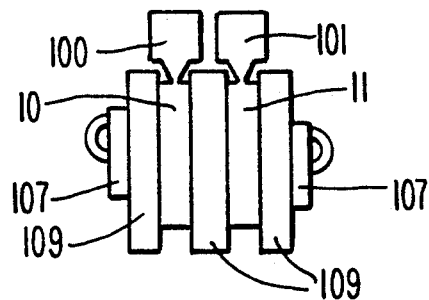
FIGS. 4a–c illustrate side and front elevation, and enlarged views of a preferred plating procedure for providing peripheral coatings on the dielectric cores of this invention.
Figure 4B:
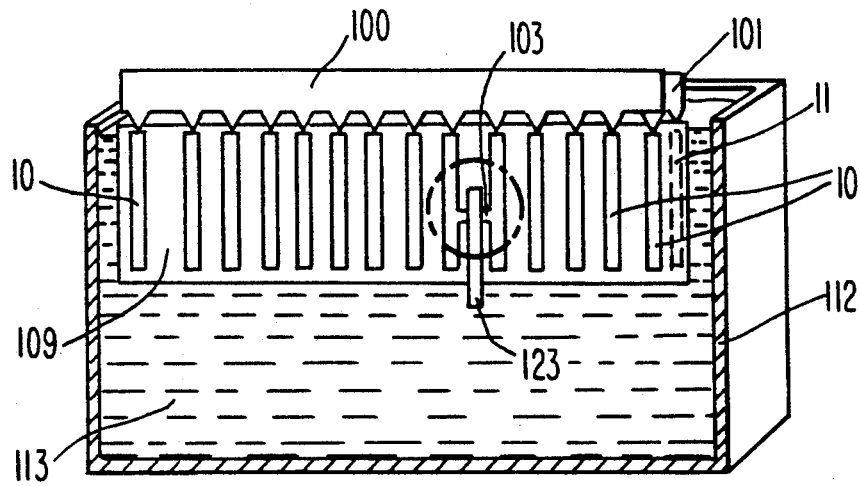
Figure 5:
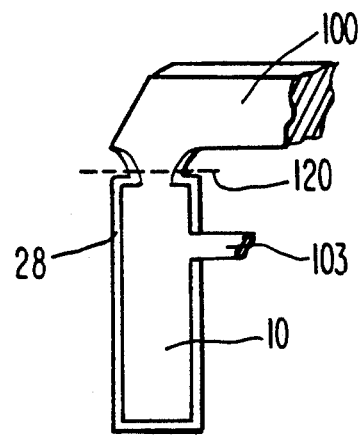
FIG. 5 illustrates a side elevation view of a preferred coated core of this invention prior to being severed from its attached sprue.

With reference to FIGS. 4a-b and 5, a preferred manufacturing sequence for preparing plated electrical leads of this invention will now be described. As is typical with polymer injection molding processes, the cores of this invention can be simultaneously injected in large numbers. Typically, injection molding processes involve the injection of liquid polymer into a metal die at high temperatures under pressurized conditions. In order to insure that the core cavities of the mold are filled with molten resin, sprues 100 and 101 are provided to provide a molten pool for feeding the core cavities until the polymer in these cavities solidifies. In accordance with an important aspect of this manufacturing process, the sprues 100 and 101 are retained with the cores 10 and 11 until one or more subsequent plating operations are completed. The sprues 100 and 101 provide effective means for retaining the cores 10 and 11 within the plating solution 113 and preferably remain above plating tank 112. As illustrated in FIGS. 4a and b, separation masks 109 can be provided along the lateral sides of cores 10 and 11 to prevent metal adhesion to the non-contact portions of the leads. Preferably, the masks are made of elastomeric silicone wafers which are clamped in place so as to provide a water-tight seal along the non-contact longitudinal sides of the leads 10 and 11. A clamping device such as clamp 107 can be provided to create a sufficient compressive force to prevent seepage of electroplating fluid 113 between the silicone wafers.

Figure 4C:
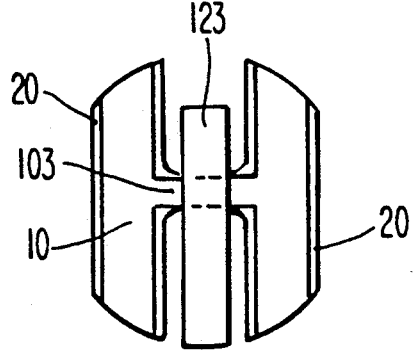

In an important alternative arrangement for the manufacturing sequence described above, a second separation plate 123 can be provided between laterally spaced cores located on the same sprue. The second separation plate 123 is preferably employed in connection with an additional dielectric bridging means. The dielectric bridging means preferably includes an injection molded bridge 103 fabricated during the molding process of the cores. The second separation plate 123, as shown more clearly in the enlarged view of FIG. 4c, is located approximately between the adjacent cores 10 so as to permit an unplated dielectric portion upon removal of the plate 123. The unplated portion may be grounded off to provide dielectric separation between two conductive paths, or left in place, such as described in FIG. 5, to provide a male connecting portion for a lead assembly, such as male dielectric portion 90.

As further described in FIG. 5, following the electroplating operation, the polymeric core, now with a conductor layer 28 can be severed from its sprue 100 at junction line 120. The severing at junction line 120 provides a second electrical discontinuity, along with the severed molded bridge, to thereby create a pair of conductive paths along the electrical lead.

Figure 6:
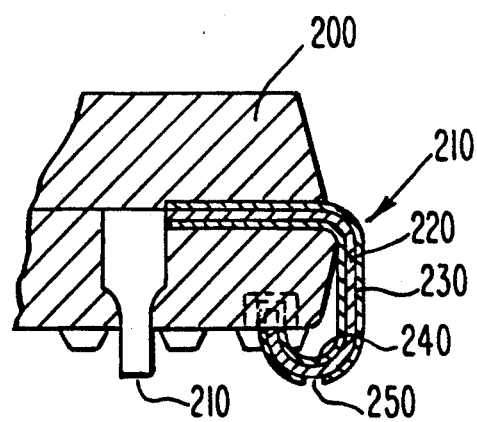
FIG. 6 is a partial front elevation view of a semiconductor device including a lead of this invention formed into a "J" configuration.

The useful applications for the leads of this invention are numerous, since the lead structures are preferably configured within the dimensions and tolerances of conventionally employed leads and lead-frames. The leads of this invention can be used in leadless chip carriers, resin and ceramic-molded chip carriers having short or through-hole leads, and all types of surface mount components. In FIG. 6, there is shown a resin-molded type chip carrier, including a molded main body 200 containing an electronic circuit element, such as a chip. Extending from the electronic circuit element are leads 210 constructed in accordance with this invention and shaped into a "J" configuration. The leads 210 include a dielectric polymeric core 220 substantially encapsulated with a metallic conductive layer and separated into two separate conductor paths 230 and 240. The separation of the conductor paths is readily accomplished by removing a portion of the metallic conductor layer at peripheral location 250. The opposite end of the lead nearest the chip also includes a discontinuous portion of the metallic conductive layer. The composite leads 210 have a structure of high integrity provided by the high density, high strength polymer core 220 and the laminated or plated conductor paths 230 and 240. The structure can be easily deformed into any desired shape without delaminating the layers or cracking the underlying core 220.

Figure 7:
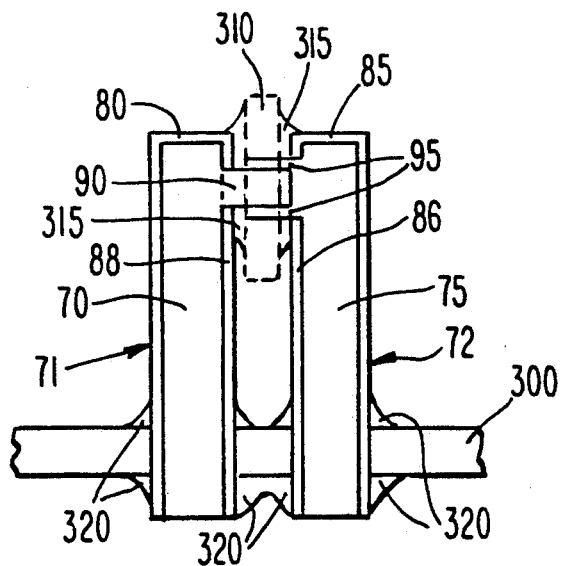
FIG. 7 is a preferred electrical lead assembly of this invention attached to a hybrid, surface mount component.

The mating lead embodiments 71 and 72 of FIGS. 3a-b are ideally employed to produce the lead assembly and hybrid mounting embodiment of FIG. 7. Preferably, the male and female dielectric portions 90 and 95 are adhered together with a suitable adhesive or joined by ultrasonic techniques. A hybrid surface mount component 310, or similar semiconductor device, is thereafter soldered using known reflow techniques to the four conductor paths 80, 88, 85, and 86 of the lead assembly with solder fillets 315. The semiconductor device 310 and lead assembly can thereafter, or simultaneously, be reflow soldered on a surface mount board location or, as illustrated in FIG. 7, in a through-hole board location of a printed circuit board 300. Solder fillets 320 help to ensure sound electrical contact as well as additional structural support for the lead assembly. It is understood that known wave soldering techniques can also be employed to produce solder fillets 320.

From the foregoing, it will be understood that this invention provides leads and electrical lead assemblies having multiple conductive paths thereon for greatly improving electrical access to high density integrated circuits. The described processes and configurations are readily incorporated into known production sequences with plating solutions and resin injection molding techniques which will be readily understandable after the principles of this invention are suggested to those in the electronics arts. This invention also provides greater flexibility for both surface mount and through-hole electronic components. Although various embodiments have been illustrated, this was for the purpose of describing and not limiting the invention. Various modifications which will become apparent to one skilled in the art, are considered within the scope of the attached claims.

What is claimed is:

1. An electrical lead comprising an elongated polymeric dielectric core and a conducting metal layer disposed thereon, said conducting metal layer having a first conductive path disposed along a first peripheral edge region of said polymeric dielectric core, and a second conductive path disposed along a second peripheral edge region of said polymeric dielectric core and electrically insulated from said first conductive path.

2. The electrical lead of claim 1, wherein said polymeric dielectric core comprises an elongated structure having top and bottom planar surfaces, said conducting metal layer disposed substantially over said top and bottom planar surfaces for providing said first and second conductive paths.

3. The electrical lead of claim 2, wherein said first and second conductive paths are electrically insulated from one another by removing a portion of said conducting metal layer to expose a portion of said polymeric dielectric core.

4. The electrical lead of claim 2, wherein said first and second conductive paths comprise copper.

5. The electrical lead of claim 1, wherein said polymeric dielectric core comprises a fiber-reinforced resin.

6. The electrical lead of claim 1 further comprising assembly joining means for connecting said electrical lead to a second electrical lead.

7. The electrical lead of claim 6, wherein said assembly joining means comprises a laterally displaced projection of said polymeric dielectric core.

8. The electrical lead of claim 1, wherein said conducting metal layer comprises a metal foil laminated to said core.

9. The electrical lead of claim 8, wherein said laminated metal comprises an extended foot portion.

10. The electrical lead of claim 9, wherein said extended foot portion comprises a tinned surface.

11. An electrical lead suitable for providing circuit continuity between an electronic device and a printed circuit board, said lead comprising an elongated polymeric dielectric core having disposed thereon a metallic conductor layer comprising at least two separate conductive paths including a first conductive path disposed along a first peripheral edge region of said polymeric dielectric core, and a second conductive path disposed along a second peripheral edge region of said polymeric dielectric core and electrically insulated from said first conductive path.

12. The electrical lead of claim 11, wherein said polymeric dielectric core comprises a plateable resin.

13. The electrical lead of claim 11, wherein said plateable resin comprises reinforcing glass fibers.

14. The electrical lead of claim 11, wherein said metallic conductor layer comprises electroless copper.

15. The electrical lead of claim 14 further comprising an electroplated copper layer disposed on said electroless copper layer.

16. The electrical lead of claim 15 further comprising a solder tinning layer disposed on said electroplated copper layer.

17. A semiconductor device comprising a molded main body containing an electronic circuit element and a plurality of electrical leads extending therefrom and existing said main body, each of said leads comprising a polymeric dielectric core having disposed thereon a metallic conductor layer comprising at least two separate conductor paths for connecting a pair of terminals disposed on said circuit element to a pair of conductive surfaces on a printed circuit board, a first conductor paths being disposed along peripheral edge regions of said dielectric core, and a second conductive path disposed along a second peripheral edge region of said polymeric dielectric core and electrically insulated from said first conductive path by an exposed portion of said polymeric dielectric core.

18. The semiconductor device of claim 17, wherein said polymeric dielectric core of each lead comprises a high strength, plateable resin.

19. The semiconductor device of claim 17, wherein said metallic conductor layer of each lead comprises a first conductive path disposed along a first peripheral edge region of said polymeric dielectric core, and a second conductive path disposed along a second peripheral edge region of said polymeric dielectric core and electrically insulated from said first conductive path by an exposed portion of said polymeric dielectric core.

20. The semiconductor device of claim 17, wherein said metallic conductor layer further comprises a plated copper layer substantially only on a top, bottom, and transverse side edge portion of said polymeric dielectric core.

21. The semiconductor device of claim 17, wherein said polymeric dielectric core comprises a glass-reinforced resin.

22. The semiconductor device of claim 17, wherein said metallic conductor layer comprises a laminated metal adhered to said polymeric dielectric core.

23. An electrical lead assembly having at least four conductive paths, and comprising a pair of leads, each of said leads having a polymeric dielectric core comprising a metallic conductive layer having at least two separate conductive paths thereon, a first of said leads comprising a dielectric, laterally extending male portion, and a second of said leads comprising a dielectric laterally extending female portion, said male and female portions being adhered together to form said lead assembly.

24. A semiconductor hybrid device assembly including a surface mount semiconductor device soldered to the lead assembly of claim 23.

* * * * *

UNITED STATES PATENT AND TRADEMARK OFFICE
CERTIFICATE OF CORRECTION

PATENT NO. : 5,297,008
DATED : March 22, 1994
INVENTOR(S) : H. Scott Estes and James J. Ganthier It is certified that error appears in the above-identified patent and that said Letters Patent is hereby corrected as shown below:

Cover page, in the title, delete "POLYMERIC COMPOSITE LEAD WIRE AND METHOD FOR MAKING SAME", and insert -- POLYMERIC COMPOSITE AND LEAD WIRE--.

Cover page, delete "Howard S. Estes, Houston, Tex." and insert --Howard S. Estes, Austin, Tex.,; James J. Ganthier, Spring, Tex.--.

Column 1, lines 1-2, delete "POLYMERIC COMPOSITE LEAD WIRE AND METHOD FOR MAKING SAME" and insert --POLYMERIC COMPOSITE AND LEAD WIRE--.

Column 2, line 11, delete "FIGS. 1a-c", and insert -- FIGS. 1a-e--.

Column 6, line 59, delete "existing", and insert -- exiting--.

Signed and Sealed this

Sixth Day of October, 1998

Attest:

BRUCE LEHMAN

Attesting Officer

Commissioner of Patents and Trademarks